United States Patent
Sendelbach et al.

(10) Patent No.: US 10,222,710 B2
(45) Date of Patent: Mar. 5, 2019

(54) METHOD AND SYSTEM FOR PLANNING METROLOGY MEASUREMENTS

(71) Applicant: NOVA MEASURING INSTRUMENTS LTD., Rehovot (IL)

(72) Inventors: Matthew Sendelbach, Fishkill, NY (US); Niv Sarig, Kfar Saba (IL); Charles N. Archie, Granite Springs, NY (US)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 53 days.

(21) Appl. No.: 15/121,479

(22) PCT Filed: Feb. 26, 2015

(86) PCT No.: PCT/IL2015/050216
§ 371 (c)(1),
(2) Date: Aug. 25, 2016

(87) PCT Pub. No.: WO2015/128866
PCT Pub. Date: Sep. 3, 2015

(65) Prior Publication Data
US 2016/0363872 A1 Dec. 15, 2016

Related U.S. Application Data

(60) Provisional application No. 61/944,842, filed on Feb. 26, 2014.

(51) Int. Cl.
*G03F 7/20* (2006.01)
*H04B 17/309* (2015.01)
(Continued)

(52) U.S. Cl.
CPC .......... *G03F 7/70625* (2013.01); *H01J 37/28* (2013.01); *H04B 17/309* (2015.01); *G01B 2210/56* (2013.01); *H04B 17/3912* (2015.01)

(58) Field of Classification Search
CPC .............. H04B 17/309; H04B 17/3912; G01B 2210/56; G03F 7/70625; H01J 37/28
See application file for complete search history.

(56) References Cited

U.S. PATENT DOCUMENTS 7,286,247 B2 10/2007 Archie
2005/0197772 A1 9/2005 Archie et al.
(Continued)

FOREIGN PATENT DOCUMENTS

EP 2658152 A2 10/2013

OTHER PUBLICATIONS

Sendelbach, M. et al., "Scatterometry Measurement Precision and Accuracy Below 70 nm," Metrology, Inspection, and Process Control for Microlithography XVII, Proceedings of SPIE, 5038 : 224-238, (2003).

(Continued)

*Primary Examiner* — Mischita L Henson
(74) *Attorney, Agent, or Firm* — Browdy and Neimark, P.L.L.C

(57) ABSTRACT

A method for use in planning metrology measurements, the method comprising: providing inverse total measurement uncertainty (TMU) analysis equations for upper and lower confidence limits $TMU_{UL}$ and $TMU_{LL}$ of the TMU being independent on prior knowledge of measurements by a tool under test (TuT) and a reference measurement system (RMS), thereby enabling estimation of input parameters for said equations prior to conducting an experiment of the TMU analysis; and determining at least one of a total number N of samples to be measured in the TMU analysis and an average number $n_s$ of measurements per sample by the RMS.

15 Claims, 8 Drawing Sheets

(51) Int. Cl.
*H01J 37/28* (2006.01)
*H04B 17/391* (2015.01)

(56) References Cited

U.S. PATENT DOCUMENTS

2006/0009872 A1* 1/2006 Prager .................. G01B 11/24
 700/121
2008/0151268 A1 6/2008 Archie et al.

OTHER PUBLICATIONS

Sendelbach, M. et.al., "Correlating scatterometry to CD-SEM and electrical gate measurements at the 90-nm node using TMU analysis" SPIE, 5375 : 686-702, (2004).

Sendelbach, M. et.al., "Feedforward of mask open measurements on an integrated scatterometer to improve gate linewidth control", SPIE 5375 : 550-563, (2004).

Liu "Computational metrology for nanomanufacturing" Proc. SPIE, Sixth International Symposium on Precision Mechanical Measurements, (Oct. 10, 2013).

Sendelbach, M. et al "Effect of measurement error budgets and hybrid metrology on qualification metrology sampling", J. Micro/Nanolithography. MEMS and MOEMS, 13 : 4, (Dec 19, 2014).—Abstact only.

* cited by examiner (GENERAL ART)

(GENERAL ART)

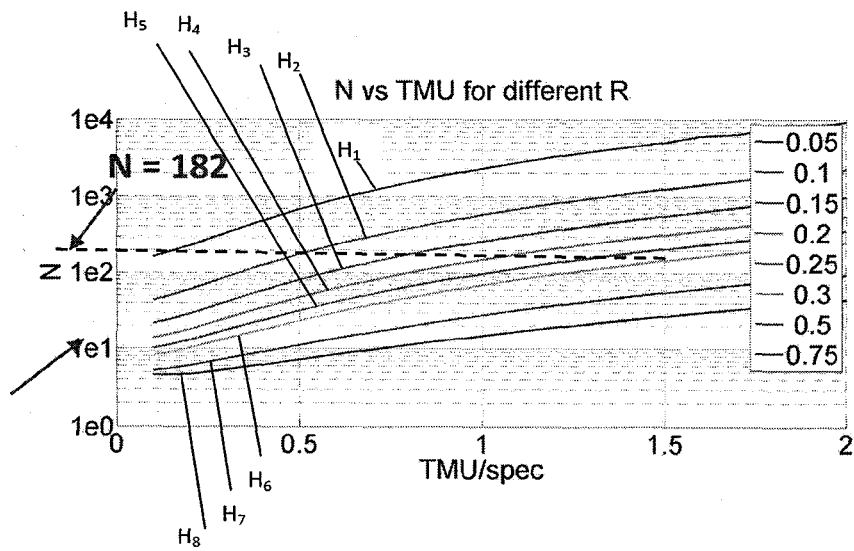
FIG. 6
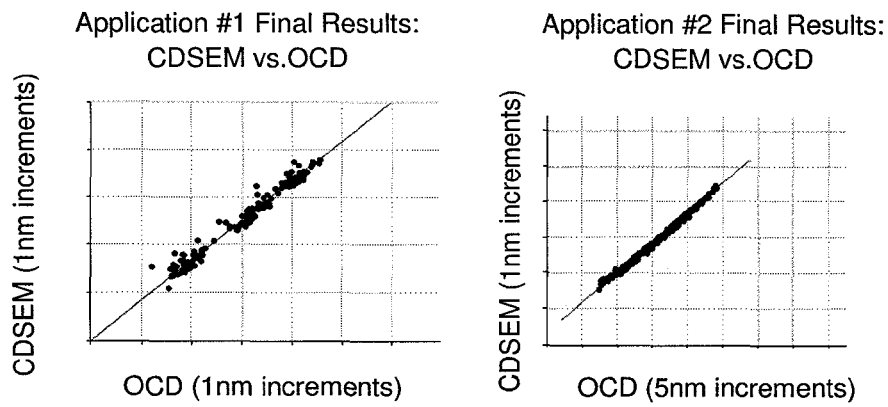
FIG. 7
FIG. 8

METHOD AND SYSTEM FOR PLANNING METROLOGY MEASUREMENTS

TECHNOLOGICAL FIELD

The present invention is generally in the field of metrology measurements, and relates to a method and system for planning the metrology measurements.

BACKGROUND

Manufacture of semiconductor structures requires highly precise and accurate metrology instruments. To this end, one of the important factors to be considered is calculation of an uncertainty of a metrology tool. Typically, this is based on the repeatability and reproducibility of a metrology tool, e.g. by performing measurements on a test sample of partially constructed wafer from a production line and estimating the static repeatability and long term reproducibility (precision). However, the repeatability and reproducibility of a measurement is meaningless if the measurement is wrong, while these techniques do not evaluate the accuracy of a metrology tool.

For example, U.S. Pat. No. 7,286,247 describes assessment and optimization for metrology instrument. According to this technique, a total measurement uncertainty (TMU) is determined based on precision and accuracy. The TMU is calculated based on a linear regression analysis and removing a reference measuring system uncertainty from a net residual error. The TMU provides an objective and more accurate representation of whether a measurement system under test has an ability to sense true product variation.

GENERAL DESCRIPTION

There is a need in the art for a novel approach to evaluation of the total measurement uncertainty (TMU), enabling to identify whether measured data obtained in a certain number of measurements (measurement sessions) includes sufficient information for further analysis, or in other words whether a metrology tool has performed a sufficient number of measurements for determination of desired parameter(s) of the structure under measurements. Indeed, over sampling (too many measurements) results in wasted resources (cost, time), while under sampling (not enough measurements) results in low confidence level/high uncertainty in result.

Typically, a Tool under Test (TuT) is evaluated in accordance with a correlation between the TuT and reference measurement system (RMS). The TMU analysis is aimed at providing a desired specification (spec) on a slope of a fit line of RMS vs TuT measurements.

Until now, metrologists had no statistics-based method to determine the sampling needed for an accuracy experiment before the start of the experiment itself. The inventors have shown a solution to this problem, termed "inverse total measurement uncertainty" (TMU) analysis, which is based on presenting statistically based equations that allows for estimating the needed sampling after providing appropriate inputs, allowing to make important "risk versus reward" sampling, cost, and equipment decisions.

The description below presents application examples using experimental data from scatterometry and critical dimension scanning electron microscope tools which demonstrate how the inverse TMU analysis methodology can be used to make intelligent sampling decisions and then to reveal why low sampling can lead to unstable and misleading results. One model is developed that can help experimenters minimize sampling costs. A second cost model reveals the inadequacy of some current sampling practices and the enormous costs associated with sampling that provides reasonable levels of certainty in the result. The inventors introduce the strategies on how to manage and mitigate these costs and begin the discussion on how fabs are able to manufacture devices using minimal reference sampling when qualifying metrology steps. Finally, the relationship between inverse TMU analysis and hybrid metrology can be explored.

Metrologists typically perform TMU analysis to evaluate accuracy of measurements. TMU analysis compares a tool under test (TuT) to a Reference Measurement System (RMS), as illustrated schematically in FIG. 1.

The most common use is assessing metrology relative accuracy and repeatability, which can be described as follows [Sendelbach and Archie, SPIE Vol. 5038, pp. 224-238, 2003]:

$$\hat{\sigma}_{Mandel}^2 = \hat{\sigma}_{TuT}^2 + \hat{\sigma}_{RMS}^2 \tag{1}$$

wherein $\hat{\sigma}_{Mandel}$ is the measure of total scatter about a best fit line, $\hat{\sigma}_{TuT}^2$ is the measure of scatter attributable to the tool under test, and $\hat{\sigma}_{RMS}^2$ is the measure of scatter attributable to RMS and any other factors, not related to the Tool under Test, that contribute to scatter.

TMU parameter can be determined as:

$$TMU \equiv 3\sqrt{\hat{\sigma}_{Mandel}^2 - \frac{RMSU^2}{9}} \tag{2}$$

wherein $$TMU \equiv 3\hat{\sigma}_{TuT} \tag{3}$$

and $$RMSU \equiv 3\hat{\sigma}_{RMS}. \tag{4}$$

As illustrated in FIG. 2, the most common form of RMSU (common for small probe metrology such as CD-SEM, AFM, TEM, XSEM) is determined by comparison of two or more RMS measurements per sample at the chip/die level [Sendelbach et. al., SPIE, Vol. 5375, pp. 686-702, 2004]:

$$RMSU = 3\sqrt{\frac{\bar{V}_s}{\bar{n}_s}} \tag{5}$$

wherein $\bar{V}_S$ is the average variance of RMS measurements across each sample, and $\bar{n}_s$ is the average number of RMS measurements per sample.

The RMS is assumed to have no systematic error; its random error, called the reference measurement system uncertainty (RMSU), can be estimated using techniques first detailed by Sendelbach et al. The RMSU has four components: one associated with the short-term precision of the RMS, one associated with the long-term precision, one with the use of multiple reference tools comprising the RMS, and one with the across-grating or across-sample variation. The uncertainty associated with the last component is not directly caused by the RMS, but must be attributed to the RMS to make sure that the TMU is only a measure of the uncertainty attributable to the TuT. In this evaluation, the CDSEM was used as the RMS. Since the CDSEM data were collected over a short period of time for each application (a few hours or less), the long-term precision component of the RMSU was minimized and assumed to be negligible. For each application, only one CDSEM tool was used, so the multiple-reference-tools component was eliminated.

The conventional technique for comparing measurement data sets of the tool under test and a reference measurement system is linear regression. One type of general linear regression analysis is the ordinary least-squares (OLS) fit. Comparing the OLS fit and TMU analysis techniques, the OLS fit suffers from dimensionless of its accuracy metric, from the fact that it is affected by range of data (comparisons often difficult), is based on assumption that RMS has no error (all error attributed to TuT), and typically has no calculation of confidence limits (little consideration for sampling). The TMU analysis, advantageously, has units of the accuracy metric, is not affected by range of data, takes into account error of RMS, and computes upper and lower confidence limits [Sendelbach et. al., SPIE Vol. 5375, pp. 550-563, 2004] (i.e. is affected by sampling).

However, the TMU calculated from the analysis is merely an estimate of the "true" TMU, i.e. ideal set of conditions (e.g., infinite sampling). The upper and lower confidence limits $TMU_{UL}$ and $TMU_{LL}$ quantify how well TMU is estimated. The standard practice for TMU analysis provides 90% confidence interval α (α=10%). Until now, $TMU_{UL}$ and $TMU_{LL}$ calculations provide very conservative estimates (larger range than necessary), are based on uncertainty in estimate of $\hat{\sigma}_{Mandel}$ and did not take into account uncertainty in estimate of RMSU.

The present invention is based on the understanding that the confidence limits s a key to applying the right sampling plan. The present invention provides novel upper and lower limits methodology approach, which is based on inverse TMU analysis. This new methodology (inverse TMU analysis) can be used to guide the intelligent selection of metrology (e.g. reference, etc.) sampling before metrology experiment is begun. Low sampling can result in misleading results, leading to wrong decisions, wasted resources. For example, the inventors have shown that for Transmission Electron Microscopy (TEM), which is considered as one of the most expensive commonly used reference measurement systems, the current typical sampling is so low that there is high level of uncertainty in the results.

According to one broad aspect of the invention, there is provided a method for use in planning metrology measurements by a tool under test (TuT). The method comprises: providing inverse total measurement uncertainty (TMU) analysis equations for upper and lower confidence limits $TMU_{UL}$ and $TMU_{LL}$ of the TMU being independent on prior knowledge of measurements by the tool under test (TuT) and a reference measurement system (RMS), thereby enabling estimation of input parameters for said equations prior to conducting an experiment of the TMU analysis; and determining at least one of a total number N of samples to be measured in the TMU analysis and an average number $n_s$ of measurements per sample by the RMS.

The inverse TMU analysis equations define the upper and lower confidence limits $TMU_{UL}$ and $TMU_{LL}$ of the TMU:

$$TMU_{UL} = TMU + \sqrt{\left(\sqrt{\frac{(N-2)}{\chi^2_{\alpha/2,N-2}}} - 1\right)^2 (TMU^2 + RMSU^2) + \left(\sqrt{\frac{N}{\chi^2_{\alpha/2,N}}} - 1\right)^2 RMSU^2}$$

-continued $$TMU_{LL} = TMU - \sqrt{\left(\sqrt{\frac{(N-2)}{\chi^2_{1-\alpha/2,N-2}}} - 1\right)^2 (TMU^2 + RMSU^2) + \left(\sqrt{\frac{N}{\chi^2_{1-\alpha/2,N}}} - 1\right)^2 RMSU^2}$$

wherein RMSU is determined as $$RMSU \equiv 3\hat{\sigma}_{RMS} = 3\sqrt{\frac{V_S}{n_S}},$$

$\hat{\sigma}_{RMS}$ being a measure of scatter attributable to RMS and any other factors, not related to the tool under test, that contribute to scatter, $\overline{V}_S$ being the average variance of RMS measurements across each sample, and $n_s$ being the average number of RMS measurements per sample; $\chi_{\alpha,N}^2$ is the lower limit of the χ squared integral with N degrees of freedoms for confidence interval (1−α/2).

The input parameters for the inverse TMU analysis equations comprise the confidence level α, and a goal for a relation R between the upper and lower confidence limits $TMU_{LL}$ and $TMU_{LL}$ and a specification spec on a slope of a fit line of RMS vs TuT measurements to be obtained, which is determined as:

$$R \equiv \frac{\Delta}{spec} = \frac{TMU_{UL} - TMU_{LL}}{spec}$$

Preferably, the input parameters for the inverse TMU analysis equations further comprise a defined spec and/or an initial estimate for an average variance $\overline{V}_s$ of RMS measurements across each sample describing the RMS uncertainty (RMSU):

$$RMSU = 3\sqrt{\frac{V_S}{n_S}}$$

In some embodiments, the reference measurement system comprises a CDSEM, e.g. a Transmission Electron Microscope (TEM). The tool under test may comprise an OCD metrology tool.

It should be noted that generally the principles of the present invention can be used in various combinations of TuT and RMS. For example, X-ray based tools may be used as reference/CD measurement (such as XPS, XRD, XRS, all of these techniques being known per se). It should be understood that a sample being measured may also be any structure, e.g. patterned structure. For example, the sample is a semiconductor wafer; OCD measurement tool may be a scatterometric tool; X-ray system may be used as reference or (O)CD measurement tool.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 5A-5B, 6 and 7 exemplify the technique of the present invention for planning gate etch in manufacturing of a 2D target, for the tool under test being a scatterometry system and the reference measurement system being CD-SEM, where FIG. 5A shows a flow chart of inverse TMU analysis of the invention; FIG. 5B illustrates the principles underlying the technique of choosing the average number $n_s$ of RMS measurements per sample, showing the total number N of samples to be measured as a function of a ratio TMU/spec for different $n_s$ values; FIG. 6 illustrates the effect of R value on the number N of samples to be measured, presenting N vs TMU/spec for different R values; and FIG. 7 shows a relation between the CD-DEM and OCD measured data corresponding to the final results for this example, according to which the sampling is properly chosen;

FIGS. 8, 9A-9B and 10A-10B exemplify the technique of the present invention for data analysis for advanced lithography application used in the manufacture of a 2D target (lines/spaces) using a scatterometry system as the tool under test and CD-SEM as the reference measurement system, where FIG. 8 illustrates the relation between the CD-SEM and OCD measured data; FIGS. 9A-9B and 10A-10B illustrate the TMU analysis results for the case that sampling values are less, where FIGS. 9A-9B show respectively the mean RMSU and mean TMU as a function of both N and $n_s$, and FIGS. 10A-10B show respectively $3\sigma$ and $\hat{\sigma}_{Mandel}^2$ of TMU as a function of both N and $n_s$; FIG. 11 shows the pass probability $P_{pass}$ as a function of measured TMU defining α- and β-risk areas of the cumulative probability; FIG. 12 schematically shows a sample with multiple structures that can be imaged for multiple measurements per sample ($n_s > 1$); FIG. 13A illustrates an effect of $n_s$ on the TEM cost; and FIG. 13B illustrates an effect of Spec on the TEM costs.

DETAILED DESCRIPTION OF EMBODIMENTS

Figure 1:
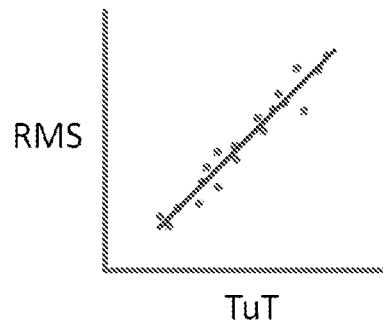
FIG. 1 illustrates a relation between a tool under test (TuT) and a Reference Measurement System (RMS) as typically used in the TMU analysis.
Figure 2:
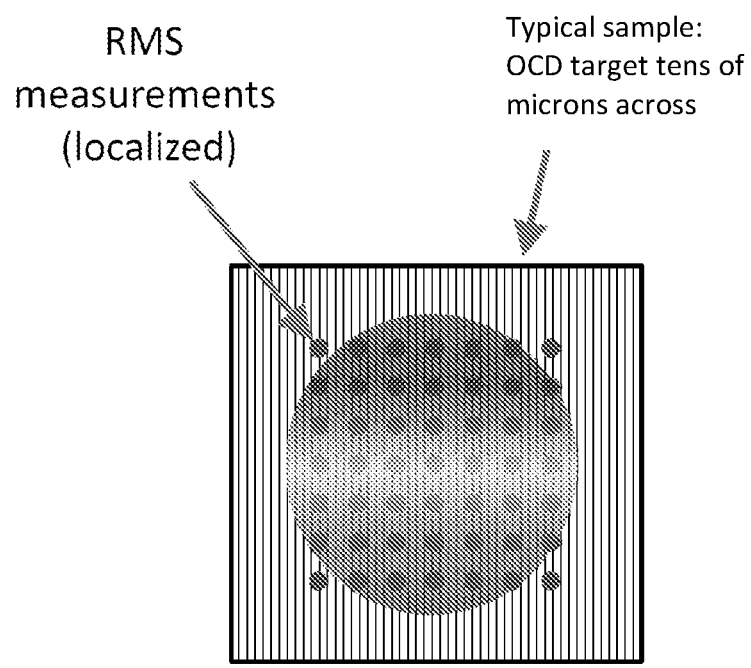
FIG. 2 illustrates the form of RMSU which is common for small probe metrology such as CD-SEM, AFM, TEM, XSEM, and is determined by comparison of two or more RMS measurements per sample at the chip/die level.

As described above, TMU analysis typically utilizes a relation between a tool under test (TuT) and a Reference Measurement System (RMS) as illustrated in FIG. 1. Equations (1) to (4) above describe the most common use is assessing metrology relative accuracy and repeatability in the TMU analysis. FIG. 2 illustrates the form of RMSU (common for small probe metrology such as CD-SEM, AFM, TEM, XSEM) determined by comparison of two or more RMS measurements per sample (e.g. wafer) at the chip/die level.

The present invention is based on considering the confidence limits for sampling planning for metrology measurements. The invention provides a novel upper and lower limits methodology, based on inverse TMU analysis, which is based on the analysis of propagation of error.

More specifically, the upper and lower confidence limits $TMU_{UL}$ and $TMU_{LL}$ are determined as follows:

$$TMU_{UL} = TMU + \sqrt{\left(\sqrt{\frac{(N-2)}{\chi_{\alpha/2,N-2}^2}} - 1\right)^2 9\hat{\sigma}_{Mandel}^2 + \left(\sqrt{\frac{N_{RMSU}}{\chi_{\alpha/2,N_{RMSU}}^2}} - 1\right)^2 RMSU^2} \quad (6)$$

$$TMU_{LL} = TMU - \sqrt{\left(\sqrt{\frac{(N-2)}{\chi_{1-\alpha/2,N-2}^2}} - 1\right)^2 9\hat{\sigma}_{Mandel}^2 + \left(\sqrt{\frac{N_{RMSU}}{\chi_{1-\alpha/2,N_{RMSU}}^2}} - 1\right)^2 RMSU^2} \quad (7)$$

wherein N is the total number of samples measured in the TMU analysis, $N_{RMSU}$ is the total number of samples measured in the determination of RMSU, $\chi_{\alpha,N}^2$ is the lower limit of the $\chi$ squared integral with N degrees of freedoms for confidence interval $(1-\alpha/2)$, and $\hat{\sigma}_{Mandel}$ is calculated, only after experiment is completed, from the set of TuT and RMS measurements.

For simplicity, in the description below, the assumption is made that $N_{RMSU} = N$.

In the above equations, the terms $$\sqrt{\frac{(N-2)}{\chi_{\alpha/2,N-2}^2}} \text{ and } \sqrt{\frac{(N-2)}{\chi_{1-\alpha/2,N-2}^2}}$$

are associated with uncertainty in $\hat{\sigma}_{Mandel}$, and the terms $\sqrt{N_{RMSU}/\chi_{\alpha/2,N_{RMSU}}^2}$ and $$\sqrt{\frac{N_{RMSU}}{\chi_{\alpha/2,N_{RMSU}}^2}} \text{ and } \sqrt{\frac{N_{RMSU}}{\chi_{1-\alpha/2,N_{RMSU}}^2}}$$

are associated with uncertainty in RMSU.

The inverse TMU analysis equations are obtained by utilizing equation (2) and inserting it $$9\hat{\sigma}_{Mandel}^2 = TMU^2 + RMSU^2$$

into the above upper and lower limit equations (6) and (7), thus obtaining:

$$TMU_{UL} = TMU + \sqrt{\left(\sqrt{\frac{(N-2)}{\chi_{\alpha/2,N-2}^2}} - 1\right)^2 (TMU^2 + RMSU^2) + \left(\sqrt{\frac{N}{\chi_{\alpha/2,N}^2}} - 1\right)^2 RMSU^2} \quad (8)$$

$$TMU_{LL} = TMU - \sqrt{\left(\sqrt{\frac{(N-2)}{\chi_{1-\alpha/2,N-2}^2}} - 1\right)^2 (TMU^2 + RMSU^2) + \left(\sqrt{\frac{N}{\chi_{1-\alpha/2,N}^2}} - 1\right)^2 RMSU^2} \quad (9)$$

These are inverse TMU analysis equations that can be solved numerically. They do not depend on the knowledge of TuT and RMS actual measurements. Thus, given estimates of inputs can be solved before experiment is begun.

Figure 3:
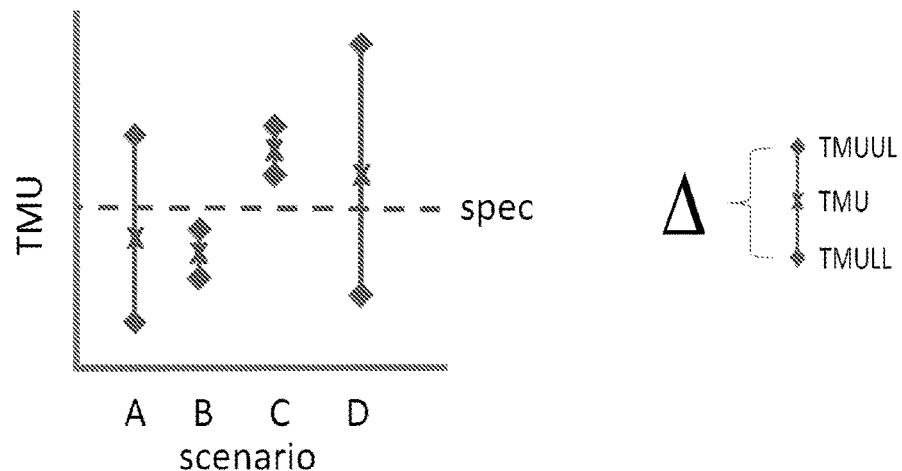
FIG. 3 exemplifies the TMU variation between its upper and lower limits.

Let us consider inverse TMU analysis variables. In this connection, reference is made to FIG. 3 illustrating four examples/scenarios A, B, C and D for the TMU variation Δ between its upper and lower limits $TMU_{UL}$ and $TMU_{LL}$. The spec line corresponds to the specification on the slope of the fit line corresponding to the corrected precision of a metrology instrument.

Each of equations (8) and (9) has five variables, as follows: α which is related to the confidence level, N which is the total number of measured samples, TMU, $TMU_{UL}$ or $TMU_{LL}$, and RMSU. Also, the variation/difference d between the upper and lower limits $TMU_{UL}$ and $TMU_{LL}$ should be considered:

$$\Delta = TMU_{UL} - TMU_{LL} \quad (10)$$

and $$R \equiv \frac{\Delta}{spec} = \frac{TMU_{UL} - TMU_{LL}}{spec} \quad (11)$$

wherein spec corresponds to a specification on the slope of the RMS vs TuT fit line (see FIG. 1) which is required as a check and balance on the corrected precision.

Hence, if Δ and R are kept small, chances that TMU passes or fails with high degree of confidence are maximized. The value of R or goal for R can be defined to be easily applied across target parameters and applications.

Figure 4:
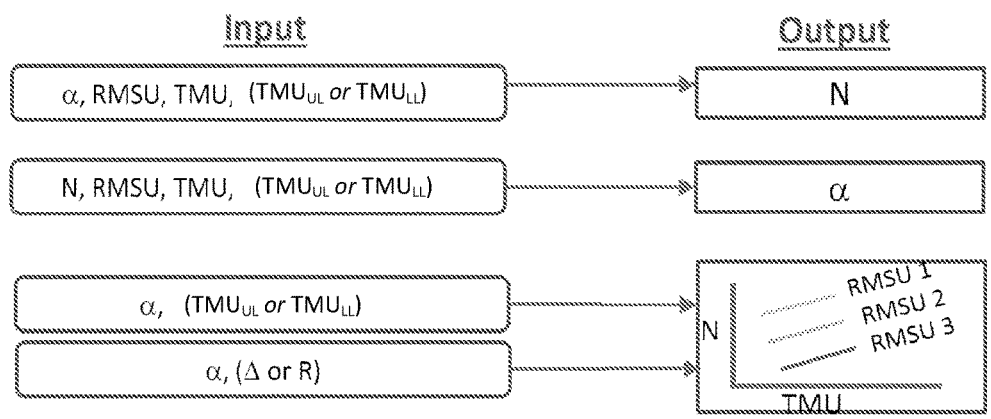
FIG. 4 illustrates how the input/output of equations of the TMU analysis can be tailored, demonstrating the interplay between the variables to be considered for the sampling decisions.

Input/output of these equations can be tailored to understand the interplay between the variables and make the sampling decisions. In this connection, reference is made to FIG. 4 exemplifying this procedure. As shown, such parameters as α, RMSU, TMU, $TMU_{UL}$ or $TMU_{LL}$ define the total number N of samples to be measured in the TMU analysis. The number N, together with RMSU, TMU, $TMU_{UL}$ or $TMU_{LL}$ define the confidence level parameter α; and α, $TMU_{UL}$ or $TMU_{LL}$ define the RMSU plot.

The following are some specific not limiting examples of using the principles of the present invention in various applications.

Figure 5A:
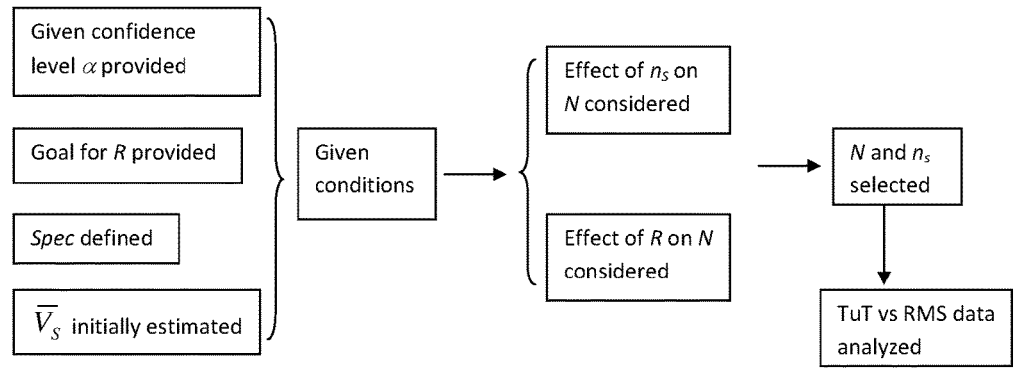

Example 1 describes gate etch in manufacturing of a 2D target; tool under test TuT is a scatterometry system measuring the parameters of a 2D target (lines/spaces); and the reference measurement system RMS is CD-SEM. The main steps of the TMU analysis are shown in FIG. 5A. The parameters to be determined are the total number N of samples to be measured in the TMU analysis, and the average number $n_s$ of RMS measurements per sample, for the given (predefined) conditions as follows: α=0.1 (90% confidence level), goal for R=20%, a defined spec (not shown), and initial estimate for the average variance $\overline{V}_s$ of RMS measurements across each sample.

Figure 5B:
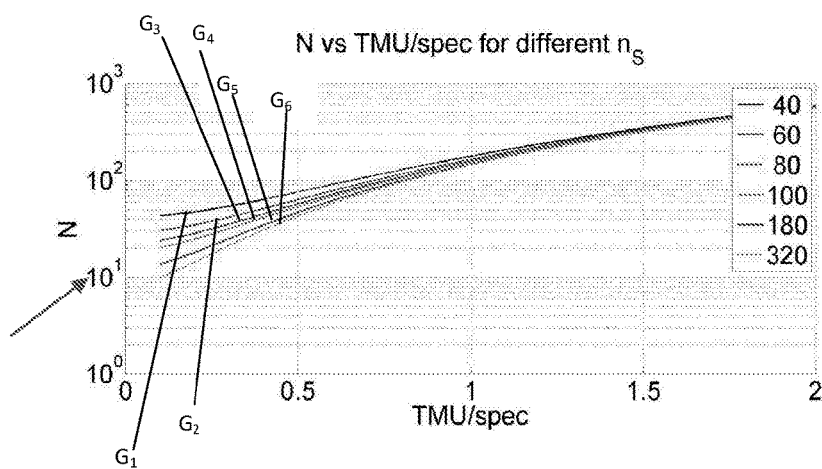

FIG. 5B illustrates the principles underlying the technique of choosing the $n_s$ value. Here, six graphs $G_1$-$G_6$ are shown presenting the total number N of samples to be measured as a function of TMU/spec for different $n_s$ values of respectively, 40, 60, 80, 100, 180, 320. Hence, the larger the number $n_s$ of RMS measurements per sample, the smaller total number N of measured sample is needed. For example, the choice may be $n_s$=180.

Then, the effect of R value on the number N is considered for choosing the N value. In this connection, reference is made to FIG. 6, showing graphs $H_1$-$H_8$ presenting the total number N of samples vs TMU/spec for different R values of respectively 0.05; 0.1; 0.15; 0.2; 0.25; 0.3; 0.5; 0.75. The goal for R may be 20%. Reducing R requires much higher sampling:

$$R \equiv \frac{\Delta}{spec} = \frac{TMU_{UL} - TMU_{LL}}{spec} \quad (12)$$

Thus, the choice for N may be N=182.

Reference is made to FIG. 7 showing a relation between the CD-DEM and OCD measured data, corresponding to the final results for this example, i.e. $n_s$=180, N=182: (TMU/spec)=1.05 and R=18.7%. As shown, the sampling is properly chosen.

Example 2 describes the data analysis for advanced lithography application in the manufacture of a 2D target (lines/spaces); tool under test TuT is a scatterometry system; and the reference measurement system RMS is CD-SEM. FIG. 8 illustrates the relation between the CD-SEM and OCD measured data using similar analysis done here as in the example 1, resulting in the sampling choice: N=295 and $n_s$=180.

Let us consider the TMU analysis results for the case that sampling values are less. To this end, stepping through N from 3 to 294 and $n_s$ from 2 to 179 is to be done; and for each (N, $n_s$) data pair, TMU analysis is performed (i.e., TMU, RMSU, etc. are calculated) using randomly selected subset of data and repeated 100 times each using a different subset of random data, mean and 3σ of metrics are calculated (from 100 TMU analyses), and each metric is plotted as a function of N and $n_s$. In this connection, reference is made to FIGS. 9A-9B and FIGS. 10A-10B showing the results of these analyses.

Figure 9A:
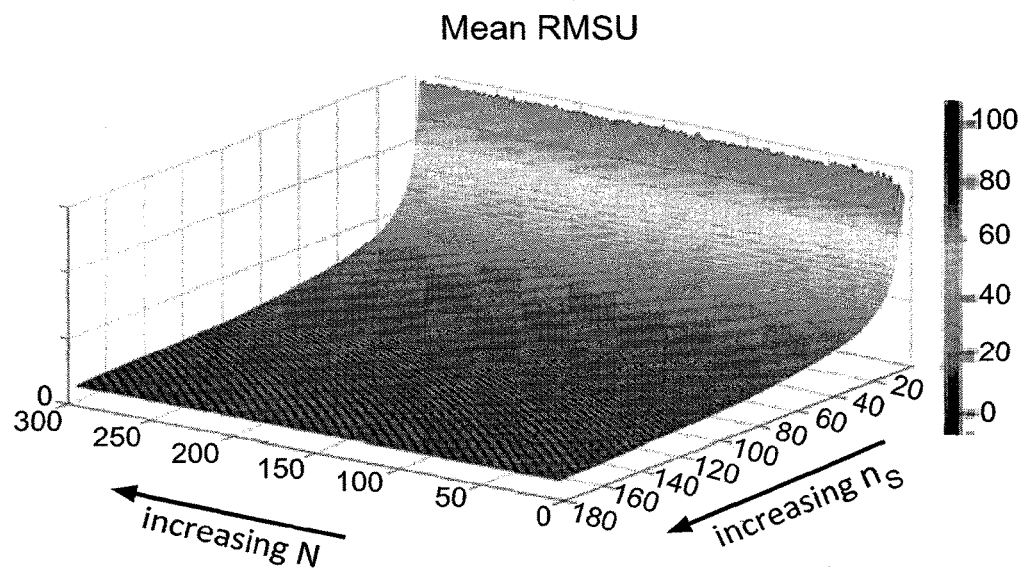
Figure 9B:
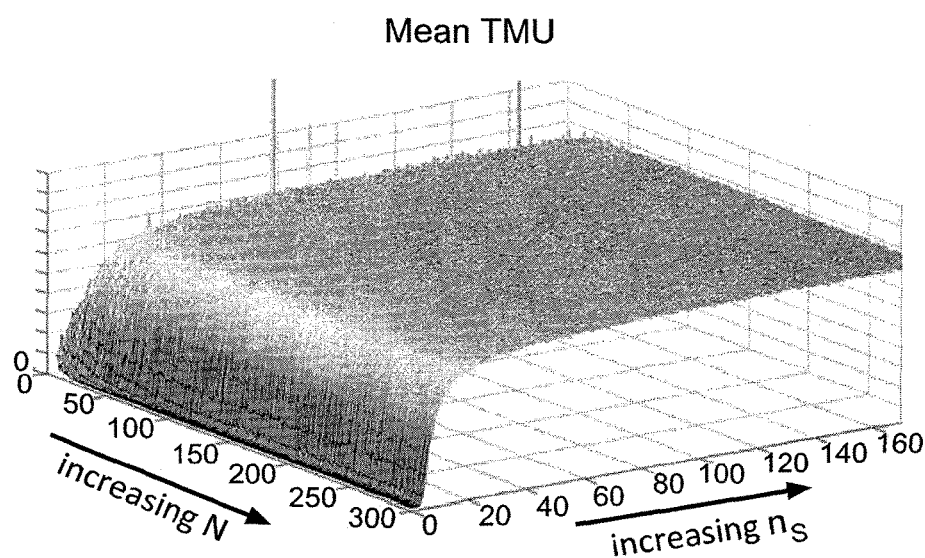
Figure 10A:
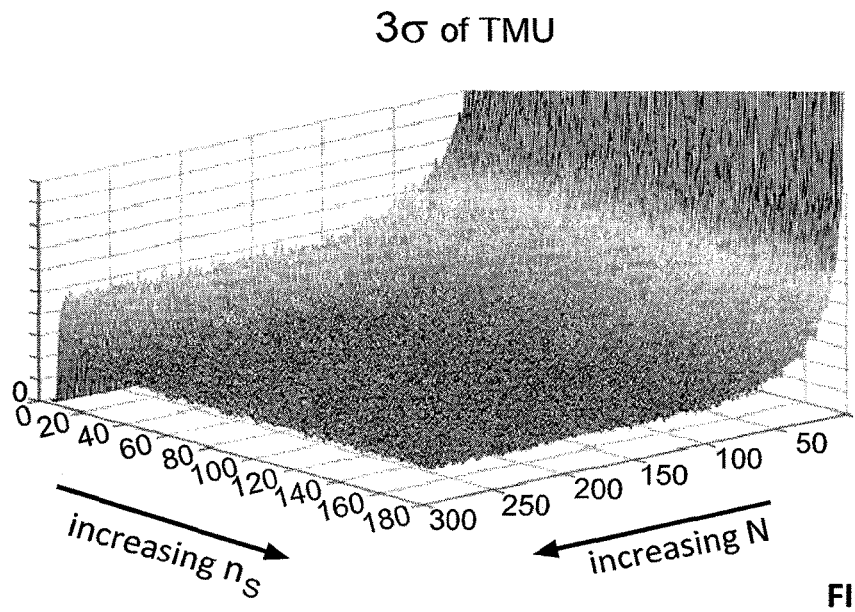
Figure 10B:
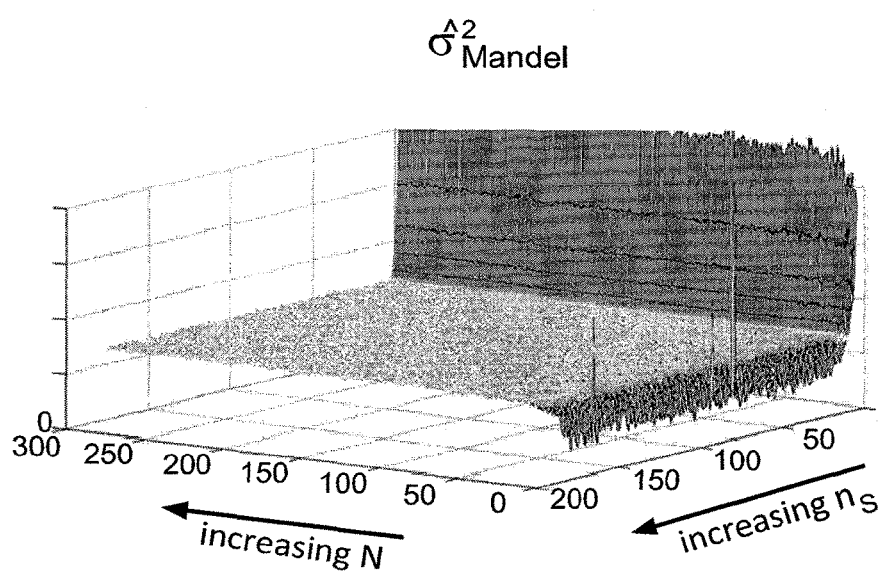

FIGS. 9A and 9B show respectively the mean RMSU and mean TMU as a function of both N and $n_s$. As shown, mean RSMU increases as $n_s$ decreases, as expected from equation (5) above:

$$RMSU = 3\sqrt{\frac{\overline{V}_s}{n_s}} ;$$

however mean TMU, which is expected to be constant, shows a sharp decrease below $n_s$~20. FIGS. 10A and 10B show respectively 3σ and $\hat{\sigma}_{Mandel}^2$ of TMU, each as a function of both N and $n_s$. As shown, 3σ increases below $n_s$~20 and increases significantly below N~50; while $\hat{\sigma}_{Mandel}^2$ (total scatter), which is expected to be constant, increases below $n_s$~20 and decreases below N~20. Thus, a choice of low N and $n_s$ values results in "unstable" or non-preferred regimes of TMU analysis. This is consistent with statistical methods according to which small sampling is not statistically significant.

Figure 11:
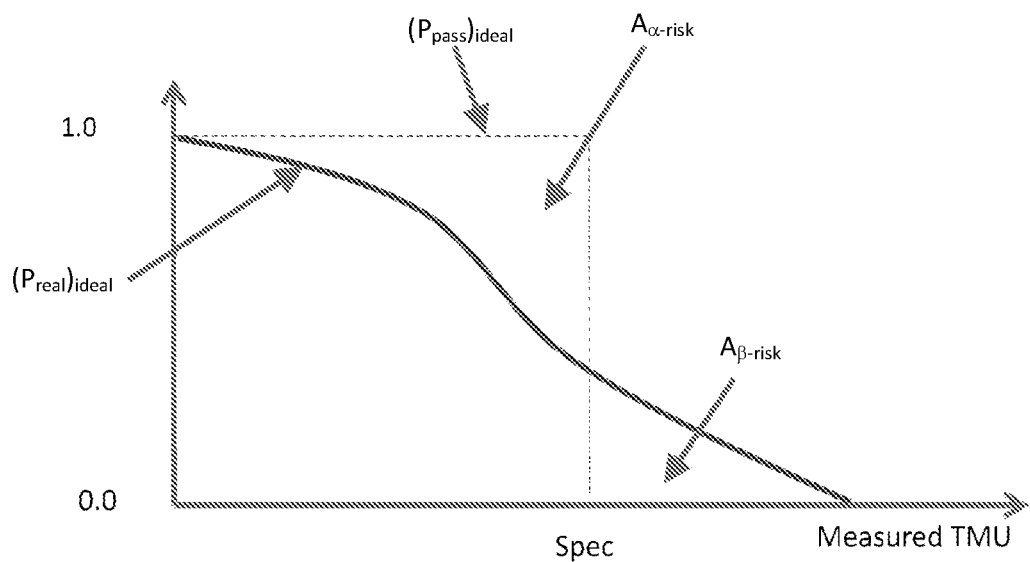
FIGS. 11, 12 and 13A-13B exemplify the cost analysis for TEM as a reference measurement system, where

The following is the description of the cost analysis. This task requires to consider the pass probability function, $P_{pass}$(TMU), which describes the probability that TuT meets TMU spec, and then evaluate the α-risk and β-risk cost function (α here is a different parameter than previously mentioned confidence level also referred to as "α"). In this connection, reference is made to FIG. 11, showing the pass probability $P_{pass}$ as a function of measured TMU. In the ideal case (i.e. infinite sample), this is a step function $(P_{pass})_{ideal}$. In reality, however, this function is in the form of curve $(P_{pass})_{real}$ where $P_{pass}$(TMU) can be smaller than 1 for TMU smaller than spec and can be higher than 0 for TMU higher than spec, thus defining a so-called α-risk area $A_{\alpha\text{-}risk}$ which is a region of the cumulative probability that the measured TMU is in spec but the "true" TMU is not in spec, and a so-called β-risk area $A_{\beta\text{-}risk}$ which is a region of the cumulative probability that the measured TMU is not in spec but the "true" TMU is in spec. It is useful to know α-risk and β-risk before an experiment is run (i.e., TMU has not been determined), as these risks represent the chance of obtaining a misleading result. These risks are to be minimized, but there is an associated cost.

The cost model developed from the pass probability function $P_{pass}$(TMU) and the above-presented inverse TMU analysis equations can be described as follows:

$$\text{Cost}(C_1, C_2, C_3, \text{Spec}, \text{RMSU}, N) = C_1\alpha_{risk} + C_2\beta_{risk} + C_3 N \quad (13)$$

wherein $C_1$ is the cost associated with determining that TMU is in spec when it is "actually" not; $C_2$ is the cost associated with determining that TMU is not in spec when it "actually" is; $C_3$ is the cost associated with the specific experiment (e.g., reference metrology).

As number N increases, α-risk and β-risk get smaller, but $C_3$ increases ($C_3$ is defined by a number of reference measurements, it increases while TMU is decreased with the number of measurements). Thus, the cost function can be optimized by differentiating with respect to spec, RMSU and N parameters.

Let us consider for example the cost model for Transmission Electron Microscopy (TEM), which is probably the most expensive of the common reference measurement systems (RMS). To this end, one needs to identify a difference between the typical sampling regime and the required one, and evaluate the sampling costs.

If the measurement costs per sample are $X (e.g. X=$3000), then the costs for the total number N of samples measured in the TMU analysis are XN. These include cost of the TEM capital equipment, parts/service, labor, and does not include wafer cost (hundreds to thousands of $-s per wafer). The use of dual-beam FIB to semi-automate sample preparation can reduce the cost by a factor of 2.

Figure 12:
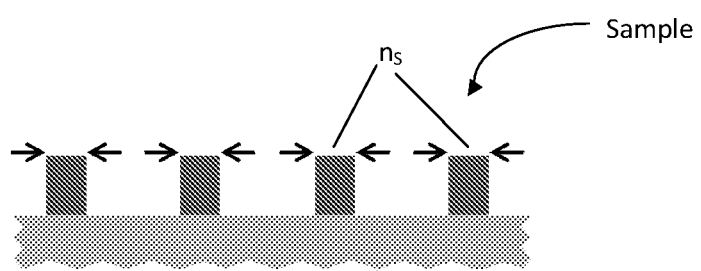

Multiple measurements per sample ($n_s$>1) can be obtained by imaging multiple structures on a sample (such as semiconductor wafer), as exemplified in FIG. 12. Very little added cost for $n_s$ smaller than about a couple dozen or so. For this model, it is assumed that there is no added cost for $n_s$>1. For the typical sampling, N varies from 2 to about 10, and $n_s$ varies from 1 to about 10. Hence, the cost of typical sampling is from $2X to $10X ($6K-$30K).

Figure 13A:
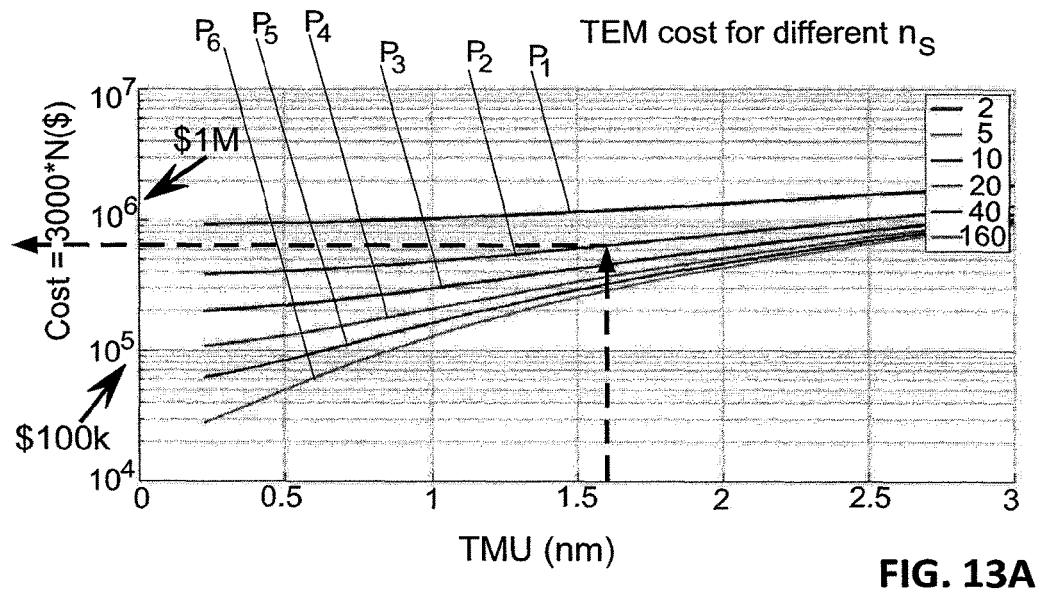

Reference is made to FIG. 13A illustrating an effect of $n_s$ on the TEM cost. Six graphs are shown $P_1$-$P_8$ corresponding to the costs for the total N samples as a function of TMU, for different $n_s$ (measurement sites per sample) being respectively 2, 5, 10, 20, 40, 160. For TEM, $\overline{V}_s$ is typically equal to 1 nm² (the average variance of RMS measurements across each sample). Considering that Spec=2 nm, R=20% and α=0.1, there is significant effect of $n_s$ on the cost: taking more measurements on a sample reduces the cost, and for TMU=spec=2 nm and $n_s$=10, the cost are about 200X (N~200), i.e. ~$600 k.

Figure 13B:
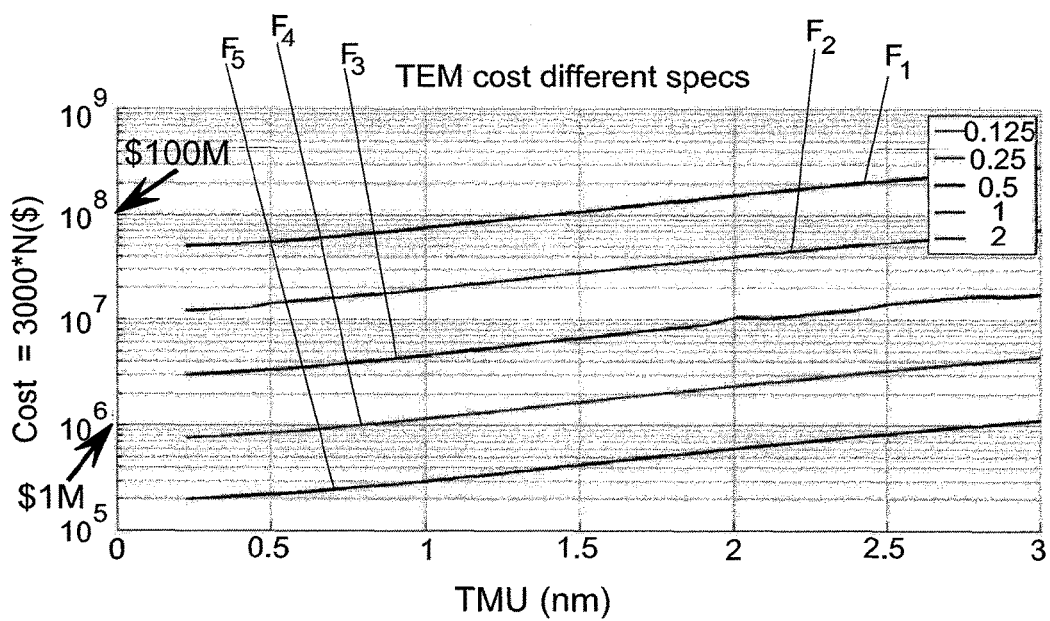

Referring to FIG. 13B, there is illustrated effect of Spec on the TEM costs. Five graphs are shown $F_1$-$F_8$ corresponding to the costs for the total N samples as a function of TMU, for different Spec values being respectively 0.125; 0.25; 0.5; 1; 2. In this example, $n_s$=10, R=20%, $\overline{V}_s$=1 nm² and α=0.1. Starting from 2 nm, the spec is reduced by factors of 2. For each reduction of spec by factor 2, the cost increases by factor 4; tighter specs force tighter error budgets (Δ), which force significant increase in the sampling and cost.

Thus, the present invention provides a novel methodology, i.e. inverse TMU analysis, to guide the intelligent selection of metrology (e.g. reference, etc.) sampling before the metrology experiment is begun. This technique is based on the understanding that low sampling can result in misleading results, leading to wrong decisions and wasted resources. The present invention provides equations to be used to create cost models. As shown in the above-described TEM example, current typical sampling is so low that there is high level of uncertainty in the results.

The invention claimed is:

1. A method for measurements planning for a metrology measurement tool under test (TuT), the method comprising:
    performing inverse total measurement uncertainty (TMU) analysis to provide estimation of sampling needed for determination of the TMU prior to conducting an experiment of the TMU analysis, said performing of the inverse TMU analysis comprising:
        defining upper and lower confidence limits $\text{TMU}_{UL}$ and $\text{TMU}_{LL}$ of the TMU being independent on prior knowledge of measurements by the TuT, wherein each of said upper and lower confidence limits $\text{TMU}_{UL}$ and $\text{TMU}_{LL}$ is a function of a number N of samples to be measured in the experiment of the TMU analysis, and a measure of scatter attributable to a reference measurement system (RMS); and
        utilizing said upper and lower confidence limits $\text{TMU}_{UL}$ and $\text{TMU}_{LL}$ to determine at least one of the total number N of samples to be measured in the experiment of the TMU analysis and an average number $n_s$ of measurements per sample by the RMS; and
    performing the experiment of the TMU analysis based on the determined number of measurements in the inverse TMU analysis.

2. A method according to claim 1, wherein the upper and lower confidence limits $\text{TMU}_{UL}$ and $\text{TMU}_{LL}$ of the TMU are defined by inverse TMU analysis equations:

$$TMU_{UL} = TMU + \sqrt{\left(\sqrt{\frac{(N-2)}{\chi^2_{\alpha/2,N-2}}} - 1\right)^2 (TMU^2 + RMSU^2) + \left(\sqrt{\frac{N}{\chi^2_{\alpha/2,N}}} - 1\right)^2 RMSU^2}$$

$$TMU_{LL} = TMU - \sqrt{\left(\sqrt{\frac{(N-2)}{\chi^2_{1-\alpha/2,N-2}}} - 1\right)^2 (TMU^2 + RMSU^2) + \left(\sqrt{\frac{N}{\chi^2_{1-\alpha/2,N}}} - 1\right)^2 RMSU^2}$$

wherein
RMSU describes an RMS uncertainty and is determined as $$RMSU \equiv 3\hat{\sigma}_{RMS} = 3\sqrt{\frac{\overline{V}_S}{n_S}},$$

$\hat{\sigma}_{RMS}$ being the measure of the scatter attributable to RMS and any other factors, not related to the tool under test, that contribute to scatter, $\overline{V}_S$ being an average variance of the RMS measurements across each sample, and $n_S$ being the average number of RMS measurements per sample;

$\chi_{\alpha,N}^2$ is the lower limit of the $\chi$squared integral with N degrees of freedoms for confidence interval $(1-\alpha/2)$, $\alpha$ being a confidence level.

3. A method according to claim 1, wherein each of said upper and lower confidence limits $TMU_{UL}$ and $TMU_{LL}$ of the $TMU_{LL}$ used in the inverse TMU analysis is a function of a confidence level $\alpha$, and a goal for a relation R between the upper and lower confidence limits $TMU_{UL}$ and $TMU_{LL}$ and a specification spec on a slope of a fit line of RMS vs TuT measurements to be obtained, which is determined as:

$$R \equiv \frac{\Delta}{spec} = \frac{TMU_{UL} - TMU_{LL}}{spec}.$$

4. A method according to claim 3, wherein each of said upper and lower confidence limits $TMU_{UL}$ and $TMU_{LL}$ of the $TMU_{LL}$ used in the inverse TMU analysis is further a function of a defined spec.

5. A method according to claim 1 wherein each of said upper and lower confidence limits $TMU_{UL}$ and $TMU_{LL}$ of the $TMU_{LL}$ is determined using an initial estimate for an average variance $\overline{V}_S$ of RMS measurements across each sample describing an RMS uncertainty (RMSU) being determined as:

$$RMSU = 3\sqrt{\frac{\overline{V}_S}{n_S}}.$$

6. A method according to claim 1, wherein the reference measurement system comprises a CDSEM.

7. A method according to claim 1, wherein the reference measurement system comprises a Transmission Electron Microscope (TEM).

8. A method according to claim 1, wherein the tool under test comprises an OCD metrology tool.

9. A method according to claim 1, wherein the sample under measurements is a semiconductor wafer.

10. A method according to claim 2, wherein input parameters for the inverse TMU analysis equations comprise the confidence level $\alpha$, and a goal for a relation R between the upper and lower confidence limits $TMU_{UL}$ and $TMU_{LL}$ and a specification spec on a slope of a fit line of RMS vs TuT measurements to be obtained, which is determined as:

$$R \equiv \frac{\Delta}{spec} = \frac{TMU_{UL} - TMU_{LL}}{spec}.$$

11. A method according to claim 10, wherein the input parameters for the inverse TMU analysis equations further comprise an initial estimate for an average variance $\overline{V}_S$ of RMS measurements across each sample describing an RMS uncertainty (RMSU):

$$RMSU = 3\sqrt{\frac{\overline{V}_S}{n_S}}.$$

12. A method according to claim 6, wherein the tool under test comprises an OCD metrology tool.

13. A method according to claim 7, wherein the tool under test comprises an OCD metrology tool.

14. A method for use in measurements planning for an OCD metrology tool, the method comprising:
providing inverse total measurement uncertainty (TMU) analysis equations for upper and lower confidence limits $TMU_{UL}$ and $TMU_{LL}$ of the TMU being independent on prior knowledge of measurements by the OCD metrology tool and a reference measurement system (RMS) comprising either a CDSEM or a TEM, thereby enabling estimation of input parameters for said equations prior to conducting an experiment of the TMU analysis;
determining at least one of a total number N of semiconductor wafers to be measured in the TMU analysis and an average number $n_S$ of measurements per semiconductor wafer by said RMS; and
performing the experiment of the TMU analysis based on the determined number of measurements in the inverse TMU analysis.

15. A method for use in measurements planning by a metrology tool to determine whether a metrology tool has performed a sufficient number of measurements for determination of one or more desired parameters of a structure under measurements, the method comprising:
providing inverse total measurement uncertainty (TMU) analysis equations for upper and lower confidence limits $TMU_{UL}$ and $TMU_{LL}$ of the TMU being independent on prior knowledge of measurements by a metrology tool and a reference measurement system (RMS), thereby enabling estimation of input parameters for said equations prior to conducting an experiment of the TMU analysis;
determining at least one of a total number N of samples to be measured in the TMU analysis and an average number $n_S$ of measurements per sample by the RMS, and
performing the experiment of the TMU analysis based on the determined number of measurements in the inverse TMU analysis.

* * * * *